United States Patent [19]

Hayakawa

[11] Patent Number: 4,656,442
[45] Date of Patent: Apr. 7, 1987

[54] HYBRID CIRCUIT DEVICE

[75] Inventor: Yasumitsu Hayakawa, Urawa, Japan

[73] Assignee: Toko, Inc., Tokyo, Japan

[21] Appl. No.: 701,211

[22] Filed: Feb. 13, 1985

[30] Foreign Application Priority Data

Feb. 27, 1984 [JP] Japan .............................. 59-27081[U]
Feb. 27, 1984 [JP] Japan .............................. 59-27082[U]
Feb. 27, 1984 [JP] Japan .............................. 59-27083[U]

[51] Int. Cl.⁴ ......................... H03H 7/32; H01K 1/14
[52] U.S. Cl. .................................... 333/140; 361/395;
  361/400; 361/404; 361/405; 174/52 FP; 174/52 PE
[58] Field of Search ............................... 333/140, 138;
  361/393–395, 397, 399, 404, 406, 412, 414, 405,
  415, 400; 174/52 PE, 52 FP

[56] References Cited

U.S. PATENT DOCUMENTS 2,607,821  8/1952  Arsdell, Jr. ......................... 361/397
3,602,846  8/1971  Hauser .................................. 333/140
4,423,468  12/1983 Gatto et al. .......................... 361/404
4,506,238  3/1985  Endoh et al. ......................... 333/138
4,521,828  6/1985  Fanning ....................... 174/52 FP X

FOREIGN PATENT DOCUMENTS 970882  7/1975 Canada ........................... 174/52 PE
3021289 12/1981 Fed. Rep. of Germany ...... 361/393

Primary Examiner—Eugene R. LaRoche
Assistant Examiner—Benny Lee

[57] ABSTRACT

A hybrid circuit device comprising a flat package incorporating an integrated circuit therein, and a delay line circuit constituted by a plurality of coils and a plurality of capacitors. A base plate supporting the delay line circuit is disposed on the flat package. First terminals which are upwardly bent and second terminals are led out of the flat package. The upwardly-bent terminals connect the integrated circuit and delay line circuit to each other at side portions of the base plate. Furthermore, separate external terminals, which are attached to the base plate and connected to the second terminals of the flat package, are provided in two rows holding the flat package therebetween. The device is encapsulated with the free end portion of each of the separate external terminals being exposed through the encapsulation at a position substantially equidistant from the top and bottom surfaces of the encapsulated device.

9 Claims, 13 Drawing Figures

HYBRID CIRCUIT DEVICE

BACKGROUND OF THE INVENTION

1. Field of the Invention

This invention relates to a hybrid circuit device wherein a delay line circuit is externally connected to an integrated circuit.

2. Description of the Prior Art

It is the recent trend that most electronic circuits are provided in the form of an integrated circuit. However, difficulties have been experienced in fabricating, in the form of an integrated circuit, an inductance containing circuit such as a delay line circuit which consists of a combination of coils and capacitors, for example. Thus, in the case of a circuit device including an integrated circuit and an element or elements which are difficult to provide in the form of an integrated circuit, it is required that such elements be externally connected to the integrated circuit. Such requirement also arises when a delay line is to be connected to a saturation type logical circuit such as TTL or the like.

Referring to FIG. 1 of the accompanying drawings, there is shown a circuit diagram of a conventional hybrid circuit device constituting a buffered delay line circuit, wherein the portion enclosed by the dotted line DL includes a plurality of coils L and capacitors C which constitute a delay line circuit. Six TTL elements G1–G6 are connected to the delay line circuit DL. These elements are provided in the form of an integrated circuit and incorporated in a flat package as enclosed by an alternate long and short dash line F in FIG. 10 of the accompanying drawings as will be explained hereinafter. In FIG. 1, an input terminal t1 is connected to the TTL element G1, and output terminals t2–t6 are led out of the TTL elements G1–G6 respectively. Indicated by Vc is a power source terminal, and denoted by E is a ground terminal.

FIG. 2 is a perspective view of the conventional constituting the circuit arrangement shown in FIG. 1 such as disclosed in U.S. patent application Ser. No. 448,630 filed Dec. 10, 1982, now Pat. No. 4,506,238 issued Mar. 19, 1985. As will be seen from FIG. 2, the conventional hybrid circuit device includes a plastic base plate 1 supporting a delay line circuit DL which comprises a plurality of coils L and capacitors C; and a flat package 2 which incorporates TTL elements G1–G6 provided in the form of an integrated circuit, wherein the base plate 1 is disposed on the flat package 2 to form a superimposed assembly which is encapsulated with plastic material in the form of a dual in-line package (referred to as DIP hereinafter) as shown by a broken line 3.

The flat package 2 has two different types of terminals 4A and 4B horizontally led out of the opposite sides thereof. The non-bent terminals 4A are cut short, whereas the remaining terminals 4B are not cut short but bent upwardly and fitted in grooves 5 formed in the side portions of the base plate 1. The terminals 4B are electrically connected to the delay line circuit DL through conductor patterns provided on the base plate 1.

The DIP 3 is provided with two rows of separate external terminals 6A and 6B which are greater in width than the terminals 4A and 4B of the flat package 2, the terminals 6A being connected to the non-bent terminals 4A of the flat package 2. As shown in FIG. 2, each of the external terminals 6A comprises an upwardly-bent end portion formed with a recess 8; a horizontal or lateral portion 7; and a downwardly-bent end portion. The upwardly-bent end portion and horizontal portion 7 of each of the terminals 6A are embedded in the encapsulation of the DIP 3, while the downwardly-bent end portion thereof is exposed through the encapsulation. The non-bent terminals 4A of the flat package 2 are disposed in engagement with the recesses 8, respectively. Attached to the base plate 1 are the external terminals 6B, each of which comprises an upwardly-bent end portion 201; a horizontal or lateral portion 9; and a downwardly-bent end portion. The upwardly-bent end portion of each of the terminals 6B is provided at the upper free end thereof with a narrow portion 10 (FIG. 2) which is substantially equal in width to the terminals 4A and 4B. The narrow portions 10 are fitted in the grooves 5 formed in the side portions of the base plate 1, and electrically connected to the delay line circuit DL. The narrow portion 10, upwardly-bent end portion and horizontal portion 9 of each of the terminals 6B are embedded in the encapsulation of the DIP 3, while the downwardly-bent end portion thereof is exposed through the encapsulation, as will also be seen from FIG. 3.

With the above-described conventional hybrid circuit device, it is required that the horizontal portions 7 and 9 of the external terminals 6A and 6B be alinged in a common horizontal plane (indicated by X1 in FIG. 3), and as will be seen from FIG. 3, the horizontal plane X1 is located at a lower level than a horizontal plane X2 in which the terminals 4A and 4B of the flat package 2 are aligned. Furthermore, it is also required that a substantial space be secured above the base plate 1 since the coils L and capacitors C constituting the delay line circuit DL are supported on the base plate 1. Thus, the position where the external terminals 6A and 6B are exposed through the encapsulation of the DIP 3, i.e., the position of the horizontal plane X1 in which the terminals 6A and 6B are aligned, inevitably becomes substantially closer to the bottom surface than to the top surface of the DIP 3, i.e., substantially lower than the position equidistant from the top and bottom surfaces of the DIP 3. A mold which can be employed for molding the encapsulation of the DIP 3 comprises upper and lower mold halves which are separable at the position corresponding to the horizontal portions 7 and 9 of the external terminals 6A and 6B; the mold cavity of the upper mold half is substantially deeper than that of the lower mold half since the position of the horizontal plane X1 in which the horizontal portions 7 and 9 of the terminals 6A and 6B are aligned, is substantially closer to the bottom surface than to the top surface of the DIP 3, that is, the position of the horizontal plane X1 is not equidistant from the top and bottom surfaces of the DIP 3, as mentioned above. Obviously, this makes it difficult to remove the molded article from the mold cavity of the upper mold half after the molding operation is over. It is the usual practice that a number of such DIP's 3 are molded at one time by using a common mold comprising upper and lower mold halves; thus, if any of the molded articles remains unremoved from the mold even after the molding operation is over, such molded article tends to become flawed. It also tends to happen that the external terminals 6A and 6B are unintentionally bent. Thus, the molding operation tends to result in a poor yield.

It is the usual practice that hybrid circuit devices of the aforementioned type are manufactured on the basis of orders received; thus, such devices are subject to various modifications, as required by customers, in terms of disposition of the conductor patterns and LC elements on the base plate 1, positions where the delay line circuit DL and the integrated circuits incorporated in the flat package 2 are to be connected together by the terminals 4A, positions where the external terminals 6A and 6B are to be attached to the base plate 1, etc. With the foregoing conventional type of hybrid circuit device, however, such modifications are very difficult to achieve for the following reasons:

(1) It is usual that the external terminals 6A and 6B are formed by using a lead frame, and the pitch thereof is predetermined.

(2) The pitch of the terminals 4A and 4B of the flat package 2 is also predetermined, and it is smaller than the pitch of the external terminals 6A and 6B. For instance, the terminal pitch of DIP provided with 14-pin external terminals is 2.54 mm, and the standard terminal pitch of a flat package provided with 14-pin external terminals is 1.27 mm. Thus, there occur positions where the terminals 4B overlap and contact the external terminals 6B attached to the base plate 1, and no external terminals 6B can be provided at such positions. For this reason, limitation is laid upon the positions where the external terminals 6B can be provided.

(3) The circuits incorporated in the flat package 2 are provided in the form of an integrated circuit; hence, it is not possible to modify the circuit arrangement. Furthermore, the roles of the terminals are predetermined in accordance with their positions. Thus, with the foregoing conventional hybrid circuit device, incovenience has been experienced in that only a limited degree of freedom is provided in terms of specification change and design change.

SUMMARY OF THE INVENTION

It is an object of the present invention to provide a novel and improved hybrid circuit device which is constructed so that a high yield of encapsulated, dual in-line packages can be achieved during molding operation and occurrence of external flaw can be avoided.

Another object of the present invention is to provide a novel and improved hybrid circuit device which is designed so that the terminal or terminals of a flat package can be coupled to the side portion or portions of a base plate for a delay line circuit at any desired position or positions, thereby making it possible to change, as desired, the positions where the integrated circuit incorporated in the flat package is connected to the delay line circuit, the positions where external terminals are attached to the base plate, etc.

Briefly, according to an aspect of the present invention, there is provided a hybrid circuit device, wherein a base plate supporting a delay line circuit comprising a plurality of coils and a plurality of capacitors are disposed on a flat package of integrated circuit; some of the terminals of the flat package are upwardly bent so that the delay line circuit and integrated circuit are connected to each other at the side portions of the above-mentioned base plate through the upwardly bent terminals; some of the remaining terminals of the flat package are coupled to separate external terminals each of which is downwardly bent at an intermediate point thereof in such a manner that the flat package is held at the opposite sides thereof between the separate external terminals; the separate external terminals are led out in two rows; and encapsulation is applied onto the entire device with the separate external terminals being exposed through the encapsulation at a position substantially equidistant from the top and bottom surfaces of the encapsulated device.

According to another aspect of the present invention, there is provided a hybrid circuit device, wherein a base plate supporting a delay line circuit, comprising a plurality of coils and a plurality of capacitors, is disposed on a flat package of integrated circuit; some of the terminals of the flat package are upwardly bent so that the delay line circuit and integrated circuit are connected to each other at the side portions of the above-mentioned base plate through the upwardly bent terminals; some of the remaining terminals of the flat package are coupled to separate external terminals each of which is downwardly bent at an intermediate point thereof in such a manner that the flat package is held at the opposite sides thereof between the separate external terminals; the separate external terminals are led out in two rows; a jumper lead member is coupled at one end thereof to at least one of the terminals of the flat package, the other end of the jumper lead being attached to the side portion of the above-mentioned base plate; and encapsulation is applied onto the entire device with the separate external terminals being exposed through the encapsulation.

Other objects, features and advantages of the present invention will become apparent from the ensuing description taken in conjunction with the accompanying drawings.

DESCRIPTION OF THE PREFERRED EMBODIMENTS

Figure 2:
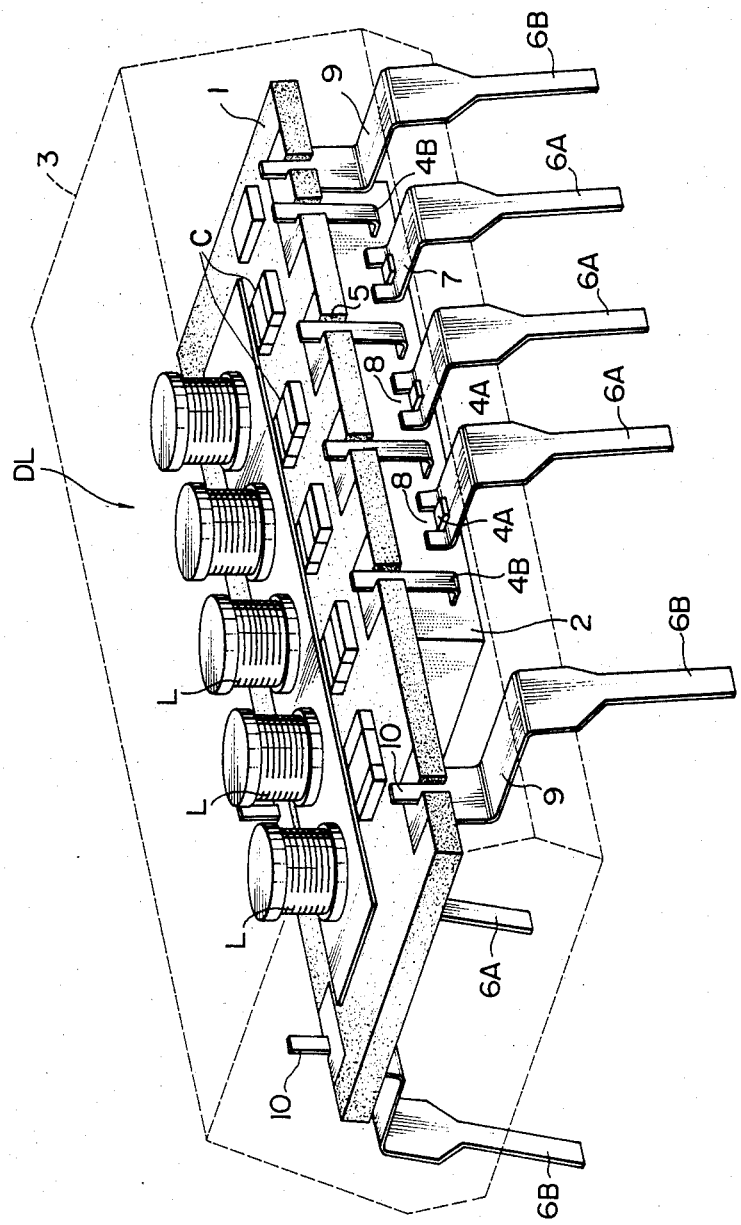
FIG. 2 is a perspective view showing a conventional hybrid circuit device wherein an integrated circuit and a delay line circuit are connected together.
Figure 4:
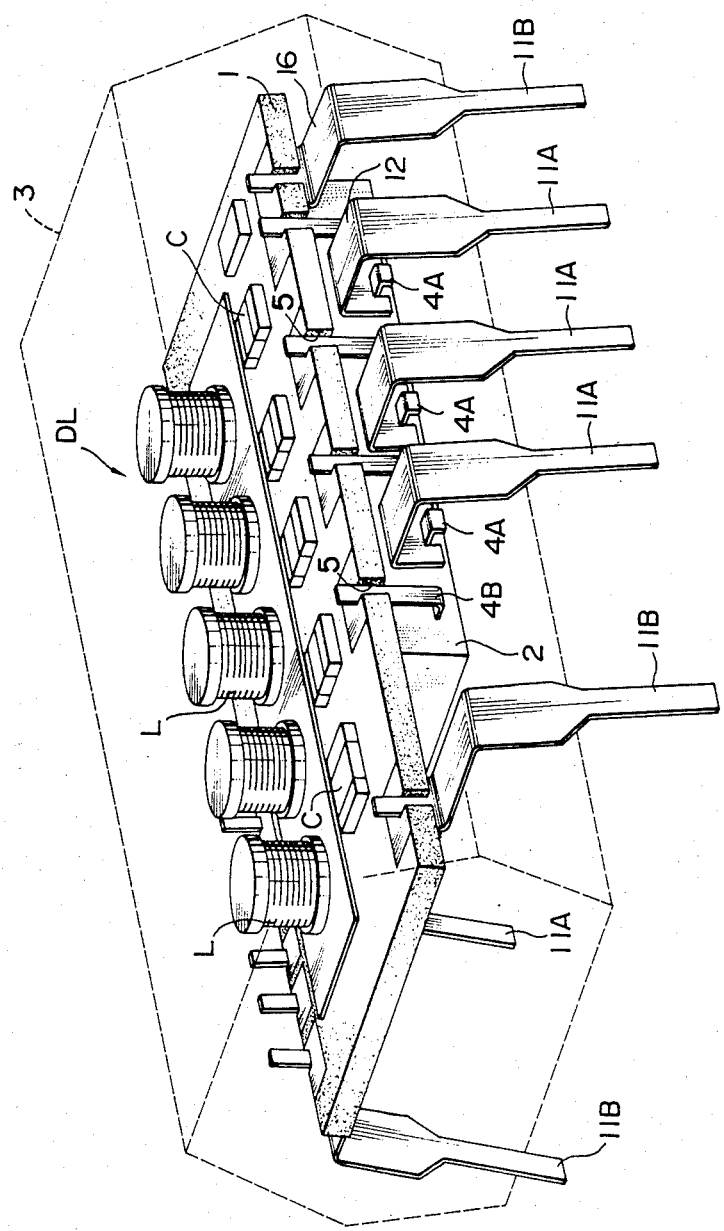
FIG. 4 is a perspective view showing the hybrid circuit device according to an embodiment of the present invention.

Referring to FIG. 4, there is shown the hybrid circuit device according to an embodiment of the present invention, wherein parts corresponding to those of FIG. 2 are shown by like reference numerals. As will be seen from FIG. 4, the present hybrid circuit device includes a base plate 1 supporting a delay line circuit DL which comprises a plurality of coils L and a plurality of capacitors C; and a flat package 2 which incorporates TTL elements G1–G6 provided in the form of an integrated circuit, wherein the base plate 1 is disposed on the flat package 2 to form a superimposed assembly which is encapsulated in the form of a dual in-line package (referred to as DIP hereinafter) as shown by a broken line 3.

The flat package 2 has two different types of terminals 4A and 4B horizontally or laterally led out of the opposite sides thereof. The terminals 4A are cut short, while the remaining terminals 4B are not cut short but bent upwardly and fitted in grooves 5 formed in the side portions of the base plate 1. Preferably, each of the terminals 4A may have its free end downwardly bent, thereby ensuring that it can be positively soldered to jumper lead members or external terminals which will be described hereinafter. The terminals 4B are electrically connected to the delay line circuit DL through conductor patterns provided on the base plate 1.

Figure 5:
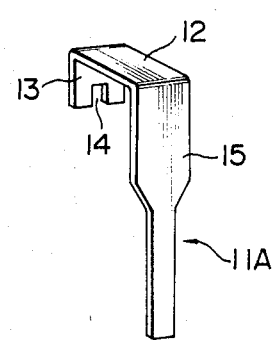
FIG. 5 is a perspective view showing the external terminal 11A shown in FIG. 4.

The DIP 3 is provided with two rows of separate external terminals 11A and 11B which are greater in width than the terminals 4A and 4B of the flat package 2, the terminals 11A being connected to the terminals 4A of the flat package 2. As shown in FIG. 5, each of the external terminals 11A comprises a horizontal or lateral portion 12; a downwardly-bent end portion provided at one end of the horizontal portion 12 and formed with a recess 14; and a downwardly-bent end portion 15 provided at the other end of the horizontal portion 12. The downwardlybent end portion 13 and horizontal portion 12 of each of the terminals 11A are embedded in the encapsulation of the DIP 3, while the other downwardly-bent end portion 15 thereof is exposed through the encapsulation. The terminals 4A of the flat package 2 are disposed in engagement with the recesses 14, respectively. Attached to the base plate 1 are the external terminals 11B (FIG. 6), each of which comprises a horizontal or lateral portion 16; an upwardly-bent end portion 17 provided at one end of the horizontal portion 16, the portion 17 being cut short; and a downwardly-bent end portion 19 provided at the other end of the horizontal portion 16. The upwardly-bent end portion 17 of each of the terminals 11B is provided at the upper free end thereof with a narrow portion 18 which is substantially equal in width to the terminals 4A and 4B. The narrow portions 18 are fitted in the grooves 5 formed in the opposite side portions of the base plate 1, and electrically connected to the delay line circuit DL. The narrow portion 18, upwardly-bent end portion 17 and horizontal portion 16 are embedded in the encapsulation of the DIP 3, while the downwardly-bent end portion 19 thereof is exposed through the encapsulation, as will also be seen from FIG. 9.

The horizontal or lateral portions 12 and 16 of the external terminals 11A and 11B are adapted, when the terminals 11A and 11B are coupled to the terminals 4A and base plate 1 respectively, to be aligned in the same plane, and the pitches of the terminals 11A and 11B are selected to be twice as large as those of the terminals 4A and 4B.

Figure 7:
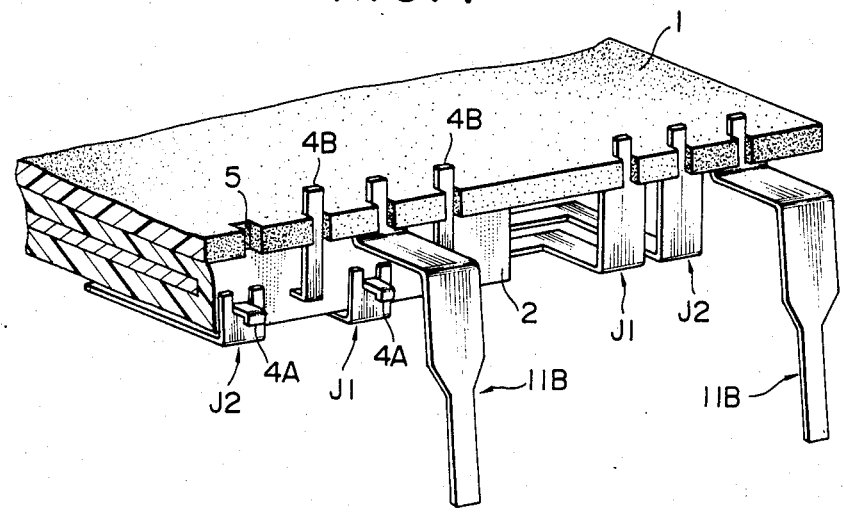
FIG. 7 is a fragmentary perspective view of the FIG. 4 hybrid circuit device as viewed from behind.

FIG. 7 is a fragmentary perspective view showing the hybrid circuit device of FIG. 4 as viewed from behind.

Figure 8:
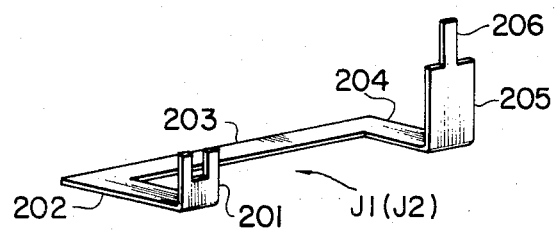
FIG. 8 is a perspective view showing the jumper lead member shown in FIG. 7.

In FIG. 7, none of the external terminals 11A is connected to the terminals 4A, which are cut short, of the flat package 2, and jumper lead members J1 and J2 such as shown in FIG. 8 are instead connected thereto at one end thereof. As will best be seen from FIG. 8, each of the jumper lead members J1 and J2 comprises a first portion 201 extending downwardly along the side face of the flat package 2 from the position where the jumper lead member is connected to the corresponding one of the terminals 4A; a second portion 202 extending at right angles to the lower end of the first portion 201; a third portion 203 extending from the other end of the second portion 202 at right angles thereto and in the same plane therewith; a fourth portion 204 extending from the other end of the third portion 203 and in parallel therewith; a fifth portion 205 upwardly extending from the other end of the fourth portion 204 at right angles thereto and in parallel with the first portion 201; and a narrow portion 206 provided at the free end of the fifth portion 205. The first portions 201 of the jumper lead members J1 and J2 are disposed along the side face of the flat package 2; the second, third and fourth portions 202, 203 and 204, thereof are disposed along the bottom face of the flat package 2; and the fifth portions 205 are also disposed along the side face of the package 2. The first portions 201 of the jumper lead members J1 and J2 are connected to the terminals 4A, and the fifth portions 205 have their narrow portions 206 disposed in engagement with the grooves 5, remote from the terminals 4A, formed in the base plate 1. Preferably, the jumper lead members J1 and J2 are made, in the form of a flat metal piece, of a flat metal frame.

Figure 6:
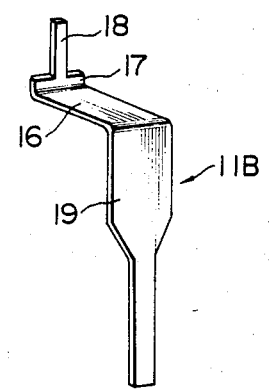
FIG. 6 is a perspective view showing the external terminal 11B shown in FIG. 4.

The external terminals 11B are attached to the base plate 1 immediately above the terminals 4A to which the jumper lead members J1 and J2 are coupled at one end thereof; however, since the end portions 17 of the external terminals 11B are short as shown in FIG. 6, the horizontal or lateral portions 16 of the external terminals 11B are spaced away from the terminals 4A to which the jumper lead members J1 and J2 are connected, and due to the presence of the horizontal or lateral portions 16, the portions 19 of the external terminals 11B are also spaced away from the terminals 4A. Thus, despite the that the terminals 4A of the flat package 2 and terminals 11B are provided in overlapping relationship with each other, these terminals are effectively prevented from contacting each other. It will be appreciated, therefore, that the positions where the external terminals 11B are to be attached to the base plate 1, can be selected as desired, without any limitation being laid thereupon by the positions of the terminals 4A.

Figure 9:
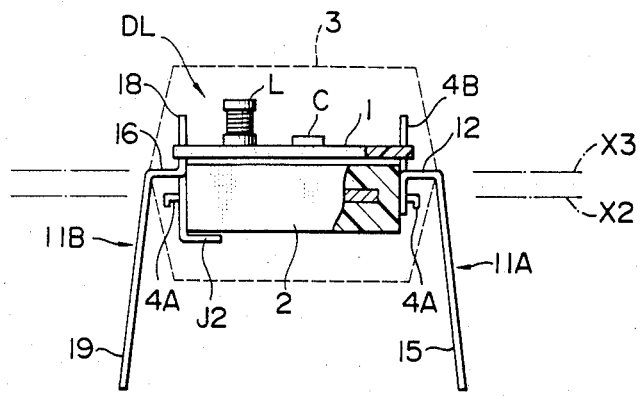
FIG. 9 is a schematic side view of the hybrid circuit device according to the present invention.

As will be seen from FIG. 9, the common horizontal plane X3 in which the horizontal portions 12 and 16 of the external terminals 11A and 11B are located, is at a higher level than the horizontal plane X2 in which the terminals 4A and 4B are aligned, and thus the position where the external terminals 11A and 11B are exposed through the encapsulation of the DIP 3, is substantially equidistant from the top and bottom surfaces of the DIP 3. This makes it possible to employ a mold comprising an upper and a lower mold half which are substantially equal in cavity depth to each other, for the purpose of molding the encapsulation of the DIP 3. As will readily be appreciated, by using such a mold, the encapsulated DIP 3 can be smoothly removed from the mold; thus, the molding operation results in a higher yield, without causing external flaw to occur in the resultant encapsulation of the DIP 3.

By using the external terminals 11A and 11B configured as shown in FIGS. 5 and 6 and the jumper lead members J1 and J2 configured as shown in FIG. 8, it is possible to cope with the situation that the pitch of the terminals 4A and 4B of the flat package 2 and that of the external terminals 11A and 11B are predetermined to be different from each other as well as the inconvenience experienced with an integrated circuit device that the terminals 4A and 4B of the flat package 2 cannot be changed in terms of role. More specifically, by connecting the delay line circuit DL and terminals 4A through the jumper lead members J1 and J2, it is possible to set up, as desired, the positions where the external terminals are to be attached to the base plate 1. It is also possible to cope with any design change and/or any specification change without replacing the base plate 1.

As will be appreciated from the above discussion, with the construction of the hybrid circuit device according to the present invention, the base plate 1 and flat package 2 can be utilized with versatility, and yet the connection between the base plate 1 and the flat package 2 can be facilitated.

Description will now be made of the manner in which the respective terminals of the hybrid circuit device shown in FIGS. 4 and 7 are connected.

Figure 1:
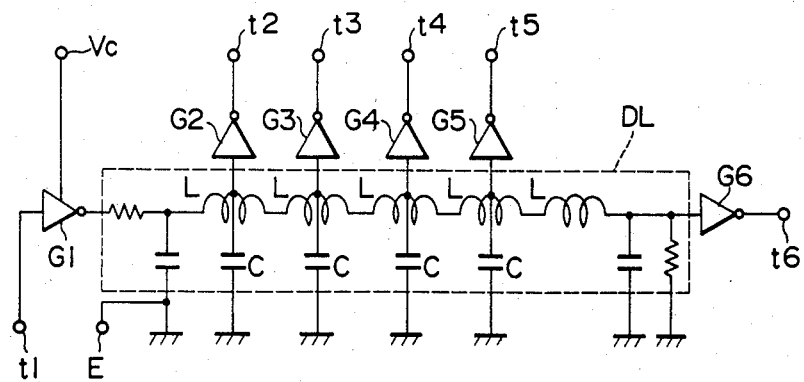
FIG. 1 is a circuit diagram of a delay line circuit connected to an integrated circuit.
Figure 3:
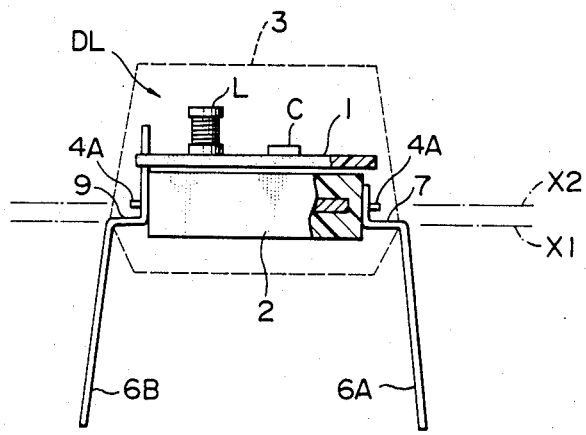
FIG. 3 is a schematic side view of the conventional hybrid circuit device.
Figure 11:
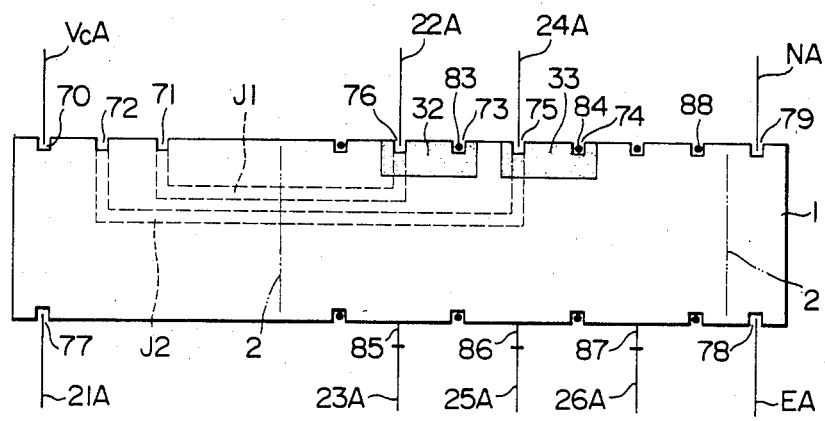
FIG. 11 is a plan view showing the base plate and flat package of FIG. 10 combined together.
Figure 10:
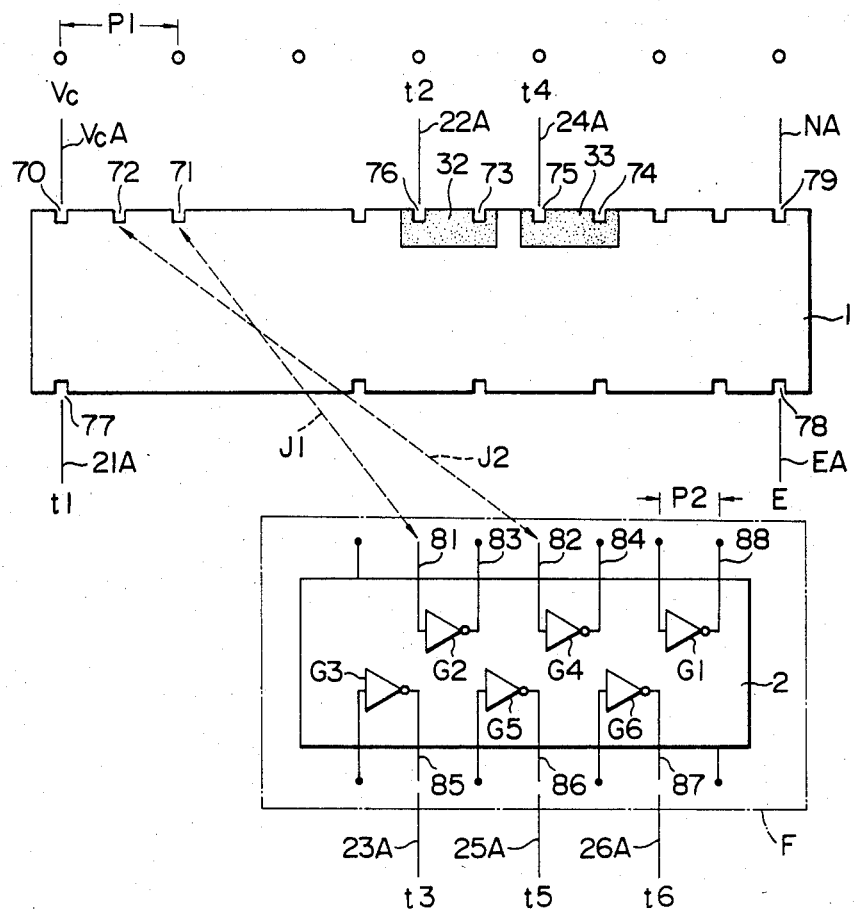
FIG. 10 is a view showing the base plate of the delay line circuit and the flat package, in which the integrated circuit is incorporated, of the hybrid circuit device of FIG. 4, in a plan view and circuit diagram, respectively, and it illustrates by way of example the manner in which the base plate and flat package are coupled to each other.

Referring to FIG. 10, there is shown the connecting relationship between the base plate 1 supporting the plural coils L and capacitors C (not shown) and the flat package 2 incorporating the TTL's G1 to G6, with the base plate 1 and flat package 2 being separated from each other. In FIG. 10, small circles which appear at the top and bottom thereof, indicate the pitch P1 of the external terminals, the pitch being predetermined in accordance with the standard of a lead frame to be used to make the external terminals, and the external terminals are denoted by 21A to 26A, VcA, NA and EA respectively. The positions where these terminals are to be attached to the base plate 1, are predetermined in accordance with the customer's specification or the like, for example. The base plate 1 is disposed on the flat package 2 as shown in FIG. 11. The pitch P1 of the external terminals is set up to be twice as large as the pitch P2 of the terminals of the flat package 2. For the sake of simplicity, only the grooves formed in the side portions of the base plate 1 and some of the conductor patterns provided around the grooves are shown in FIG. 10. The external terminal VcA serving as power source terminal Vc (see FIG. 1), external terminal 21A serving as input terminal t1, and external terminal EA serving as ground terminal E are securely fitted in the grooves 70, 77 and 78 respectively, and these external terminals are connected to the delay line circuit DL through other conductor patterns (not shown) provided on the base plate 1. Securely fitted in the groove 76 is the external terminal 22A serving as output terminal t2, which in turn is electrically connected to the groove 73 through the conductor pattern 32. Also securely fitted in the groove 75 is the external terminal 24A serving as output terminal t4, which in turn is electrically connected to the groove 74 through the conductor pattern 33. All the external terminals mentioned just above are similar in construction to the external terminals 11B of FIG. 6.

In the flat package 2, the six TTL elements G1 to G6 are provided in the form of integrated circuit, and terminals 81 to 88 are horizontally or laterally led out of the flat package 2. Of the terminals 81 to 88, the terminals having no black dots indicated at the free ends thereof are cut short like the terminals 4A of FIG. 4, while the terminals having black dots indicated at the free ends thereof are not cut short but upwardly bent, like the terminals 4B of FIG. 4, to be securely fitted in the corresponding one of the aforementioned grooves from underneath the base plate 1. The output terminals 85, 86 and 87 of the TTL elements G3, G5 and G6 are bent downwardly and connected to the external terminals 23A, 25A and 26A serving as terminals t3, t5 and t6 of FIG. 1 respectively. The external terminals 23A, 25A and 26A are similar in construction to the external terminals 11A of FIG. 5. Fitted in the groove 73 of the base plate 1 is the output terminal 83 of the TTL element G2, which in turn is connected to the external terminal 22A through the conductor pattern 32. The input terminal 81 of the TTL element G2 is electrically connected to the groove 71 of the base plate through the jumper lead member J1. The delay line circuit DL is connected to the groove 71 through another conductor pattern (not shown) so that the terminal 81 is connected to the delay line circuit DL. The output terminal 84 of the TTL element G4 is fitted in the groove 74 of the base plate 1 and electrically connected to the external terminal 24A through the conductor pattern 33. The input terminal 82 of the element G4 is electrically connected to the groove 72 of the base plate 1 through the jumper lead member J2 and thence to the delay line circuit DL.

FIG. 11 is a plan view showing the base plate 1 as being disposed on the flat package 2, wherein the alternate long and short dash lines indicate the position of the flat package 2, and the broken lines show the jumper lead members J1 and J2.

Figure 12:
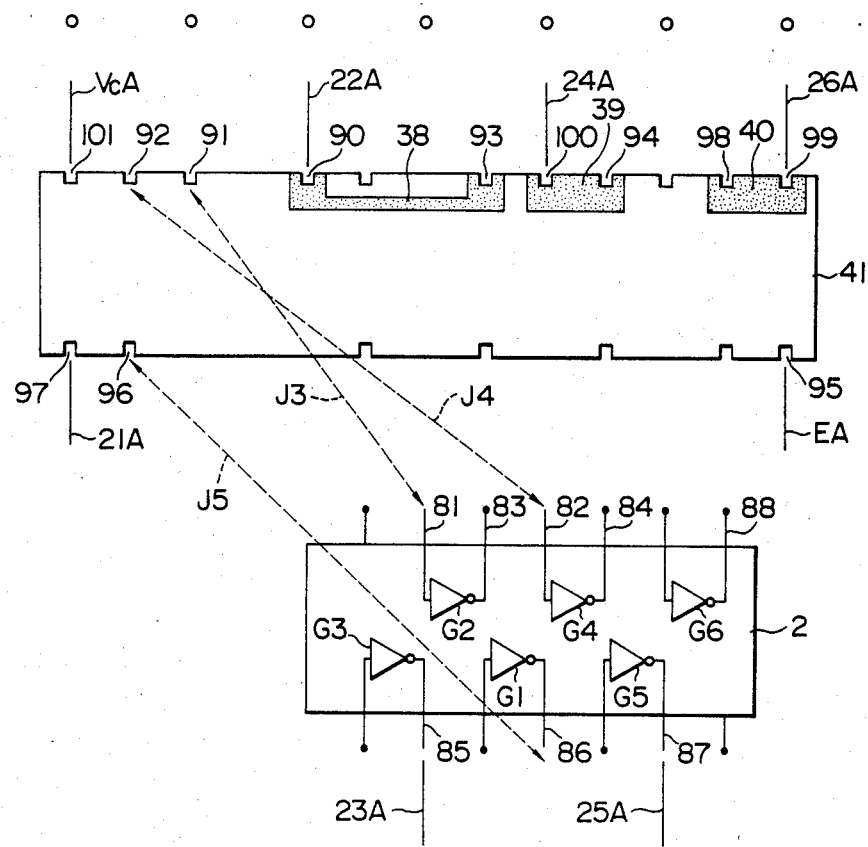
FIG. 12 is a view showing the base plate and flat package of the hybrid circuit device according to another embodiment of the present invention, in a plan view and circuit diagram, respectively, and it illustrates by way of example the manner in which the base plate and flat package are coupled together.
Figure 13:
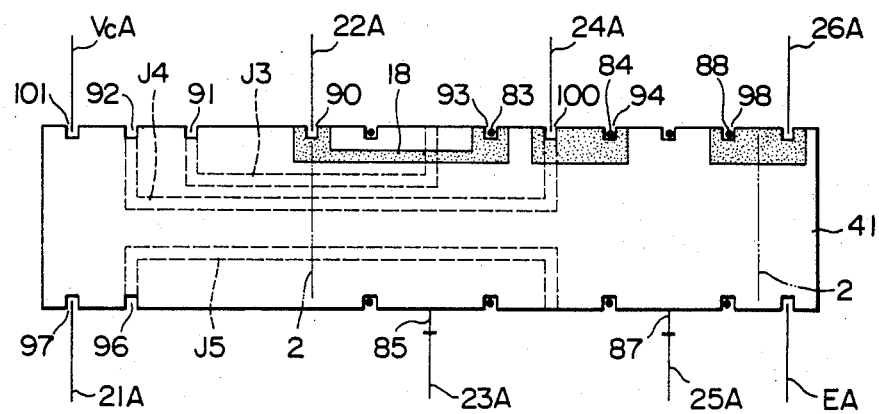
FIG. 13 is a plan view showing the base plate and flat package of FIG. 12 combined together.

Referring to FIGS. 12 and 13, there is shown the hybrid circuit device according to another embodiment of the present invention. FIGS. 12 and 13 correspond to FIGS. 10 and 11 respectively, except that a base plate 41 is different in construction from the base plate 1 shown in FIGS. 10 and 11. FIG. 12 shows, in a plan view, the base plate 41 supporting the delay line circuit DL, and the flat package 2. Small circles which are indicated at the top and bottom of FIG. 12 show the positions where external terminal may be present, and such positions are predetermined as specified by the standard of a lead frame of which the the external terminals are made.

In FIG. 12, for the sake of simplicity, the base plate 41 is shown only with respect to grooves formed in the side portions thereof and some of the conductor patterns provided around the grooves. Securely fitted in the grooves 101, 97, 95 are external terminal VcA, external terminal 21A and ground terminal EA, respectively, which in turn are connected to the delay line circuit DL through conductor patterns (not shown). Also securely fitted in the grooves 90, 100 and 99 are external terminals 22A, 24A and 26A respectively. The external terminals according to this embodiment are similar in construction to the external terminals 11B of FIG. 6. The external terminals 22A, 24A and 26A are electrically connected to the grooves 93, 94 and 98 through conductor patterns 38, 39 and 40 respectively. The flat package 2 is similar in construction to that used in the embodiment shown in FIG. 10, except that the disposition of the TTL elements G1 to G6 is changed. Of terminals 81 to 88 horizontally or laterally led out of the flat package 2, the terminals having no black dots indicated at the free ends thereof are cut short like the terminals 4A of FIG. 4, whereas the terminals having black dots indicated at the free ends thereof are not cut short but, like the terminals 4B of FIG. 4, upwardly bent and securely fitted in the corresponding ones of the grooves from underneath the base plate 41, respectively. The output terminals 85 and 87 of the TTL elements G3 and G5 are connected to the external terminals 23A and 25A which are similar in construction to the external terminals 11A of FIG. 5, respectively. The output terminal 83 of the TTL element G2 is securely fitted in the groove 93 and thence connected to the external terminal 22A through the conductor pattern 38. The input terminal 81 of the TTL element G2 is electrically connected to the groove 91 of the base plate 41 through a jumper lead member J3 which is in the form of a flat metal piece formed of a lead frame. The groove 91 is electrically connected to the delay line circuit DL through another conductor pattern (not shown).

The input terminal 82 of the TTL element G4 is electrically connected to the groove 92 through a jumper lead member J4, and the ouput terminal 86 of the TTL element G1 is electrically connected to the groove 96 through a jumper lead member J5.

FIG. 13 shows the base plate 41 as being disposed on the flat package 2, wherein the alternate long and short dash lines indicate the position of the flat package 2, and the broken lines show the jumper lead members J3, J4 and J5.

While the present invention has been described and illustrated with respect to some specific embodiments thereof, it is to be understood that the present invention is by no means limited thereto but encompasses all changes and modifications which will become possible within the scope of the appended claims.

I claim:

1. A hybrid circuit device comprising:
a flat package incorporating an aintegrated circuit therein;
a further circuit comprising a plurality of coils and a plurality of capacitors;
a dielectric base plate supporting said further circuit, said base plate being disposed on said flat package and having opposed side portions for engagement with terminals of said flat package;
first, upwardly bent, terminals extending out of said flat package and electrically components of said further circuit to components of said integrated circuit at the side portions of said base plate;
second terminals extending out of said flat package;
first separate external terminals electrically connected to said second terminals of said flat package respectively;
second separate external terminals electrically connected to the side portions of said base plate;
said first separate external terminals and said second separate external terminals having horizontal portions extending outwardly from a side of said flat package and lying substantially in a common plane, said plane being located between said base plate and said second terminals the horizontal portion of each of said first separate external terminals being physically spaced apart from said second terminals, and extending to a vertical portion contiguous to said flat package which is bent downwardly to electrically engage with one of said second terminals;
said first and second separate external terminals being downwardly bent in such a manner as to extend out in two opposing rows to form a dual in-line package holding said flat package therebetween; and
encapsulation surrounding said base plate and said flat package, with an end portion of each of said first and second separate external terminals being exposed through said encapsulation.

2. A hybrid circuit device according to claim 1, wherein each of said second terminals of said flat package has said end portion bent downwardly.

3. A hybrid circuit device according to claim 1, wherein said first separate external terminals are made to be greater in width, as measured along said side portions, than the second terminals of said flat package; the horizontal portion of each of said first separate external terminals extends to a further portion contiguous said flat package and bent downwardly; a recess is formed in the further portion of each of said first separate external terminals; and said second terminals of said flat package are disposed for engagement with said recesses.

4. A hybrid circuit device according to claim 1, wherein a jumper lead member of predetermined configuration is electrically connected at one end thereof to at least one of said second terminals of the flat package, the other eend of said jumper lead member being electrically coupled to the side portion of said base plate supporting said further circuit.

5. A hybrid circuit device according to claim 4, wherein said jumper lead member is made of a flat metal piece.

6. A hybrid circuit device comprising:
a flat package incorporating an integrated circuit therein;
a delay line circuit comprising a plurality of coils and a plurality of capacitors;
a dielectric base plate supporting said delay line circuit, said base plate being disposed on said flat package and having opposed side portions for engagement with terminals of said flat package;
first, upwardly bent, terminals extending out of said flat package and electrically connecting components of said delay line circuit to components of said integrated circuit at the side portions of said base plate;
second terminals extending out of said flat package;
first separate external terminals electrically connected to respective ones of a plurality of said second terminals of said flat package respectively;
second separate external terminals electrically connected to the side portions of said base plate, said first and said second separate external terminals having horizontal portions extending outwardly from a side of said flat package and lying substantially in a common plane, said plane being located between saidd base plate and said second terminals;
said first and second separate external terminals being downwardly bent in such a manner as to extend out in two opposing rows to form a dual in-line package holding said flat package therebetween; and encapsulation surrounding said base plate and said flat package, as to have an end portion of each of said first and said second separate external terminals being exposed through said encapsulation; and wherein said first separate external terminals are made to be greater in width, a measured along said side portions, than the second terminals of said flat package; the horizontal portion of each of said first separate external terminals being physically spaced apart from said second terminals, and extends to a further portion contiguous to said flat package and bent downwardly; a recess is formed in the further portion of each of said first separate external terminals; and said second terminals of said flat package are disposed for engagement with said recesses; and wherein at least one of said second separate external terminals is connected to a side portion of said base plate immediately above one of said second terminls of the flat package and extends out in such a manner as not to contact said one of said second terminals of the flat package, wherein said one of said second terminals is free of connection with one of said first separate external terminals.

7. A hybrid circuit device according to claim 6, wherein a jumper lead member is electrically connected at one end thereof to one of said second terminals of the flat package, the other end of said jumper lead member being electrically connected to the side portion of said base plate at a position remote from said one of said second terminals of the flat package.

8. A hybrid circuit device comprising:
a flat package incorporating an integrated circuit therein;
a further circuit comprising a plurality of coils and a plurality of capacitors;
a dielectric base plate supporting said further circuit, said base plate being disposed on said flat package and having opposed side portions for engagement with terminals of said flat package;
first, upwardly bent, terminals extending out of said flat package and electrically connecting components of said further circuit to components of said integrated circuit at the side portions of said base plate;
second terminals extending out of said flat package;
first separate external terminals electrically connected to said second terminals of said flat package respectively;
second separate external terminals electrically connected to the side portions of said base plate;
said first separate terminals and said second separate external terminals having horizontal portions extending outwardly from a side of saiad flat package and lying substantially in a common plane, said plane being located between said base plate and said second terminals, the horizontal portion of each of said first separate terminals being physically spaced apart from said second terminals, and extending to a vertical portion contiguous to said flat package which is bent downwardly to electrically engage with one of said second terminals;
said first and second separate external terminals being downwardly bent in such a manner as to extend out in two opposing rows to form a dual in-line package holding said flat package therebetween;
a jumper lead member connected at one end thereof to at least one of said second terminals of the flat package, the other end of said jumper lead member being connected to the side portion of said base plate; and
encapculation surrounding said base plate and said flat package, with an end portion of each of said first and second separate external terminals being exposed through said encapsulation.

9. A hybrid circuit device according to claim 8, wherein said jumper lead member is made of a flat metal piece.

* * * * *